United States Patent [19]

Recine, Sr.

[11] Patent Number: 5,064,476
[45] Date of Patent: Nov. 12, 1991

[54] THERMOELECTRIC COOLER AND FABRICATION METHOD

[76] Inventor: Leonard J. Recine, Sr., 2500 Trophy Dr., Plano, Tex. 75025

[21] Appl. No.: 583,157

[22] Filed: Sep. 17, 1990

[51] Int. Cl.$^5$ .................... H01L 35/34; H01L 37/00
[52] U.S. Cl. ................................. 136/201; 136/200; 136/212; 136/224
[58] Field of Search ............... 136/200, 201, 203, 212, 136/224, 225; 62/3.2, 3.3, 3.4, 3.6, 3.7, 77; 156/630, 247, 248, 268

[56] References Cited

U.S. PATENT DOCUMENTS

| | | | |
|---|---|---|---|
| 2,747,977 | 5/1956 | Eisler | 41/43 |
| 3,022,360 | 2/1962 | Pietsch | 136/4 |
| 3,151,007 | 9/1964 | Dahlberg | 148/177 |
| 3,197,844 | 8/1965 | Bassett, Jr. | 29/155.5 |
| 3,209,433 | 10/1965 | Meyer et al. | 29/155.5 |
| 3,252,205 | 5/1966 | Hancock et al. | 29/155.5 |
| 3,261,713 | 7/1966 | Groten | 117/212 |
| 3,264,152 | 8/1966 | Haydon | 156/3 |
| 3,269,871 | 8/1966 | Kilp et al. | 136/203 |
| 3,580,743 | 5/1971 | MacPhee et al. | 136/212 |
| 4,468,557 | 8/1984 | Bylin et al. | 219/535 |
| 4,567,762 | 2/1986 | Hoppert et al. | 73/304 R |

Primary Examiner—Brooks H. Hunt
Assistant Examiner—Chrisman D. Carroll

[57] ABSTRACT

An improved thermoelectric device and fabrication process wherein in a first embodiment strips of conductive material are attached to corresponding strips of adhesive material and first and second patterned arrays of tabs are struck from the strips onto the adhesive strips. In a second embodiment strips of conductive material are blanked to form the first and second patterned arrays of tabs and substantially simultaneously therewith the arrays of tabs are partially returned to their strips which now serve as support frames for the tab arrays. The array of tabs have either flat rectangular surfaces or flat peanut shaped surfaces with or without round shaped pockets adjacent to each end. Round pockets are used to receive legs of thermoelectric material of any shape without orientation. The first and second patterned tab arrays are attached to plates of insulation material and the adhesive strips or the strip frames removed, as applicable, to form first and second side plates. Then legs of thermoelectric material are attached to ends of conductive tabs of the arrays of tabs as appropriate to complete the thermoelectric device.

15 Claims, 5 Drawing Sheets

THERMOELECTRIC COOLER AND FABRICATION METHOD

This invention relates to thermoelectric coolers and more particularly to a thermoelectric cooler having conductive type tabs and an improved method of manufacture.

BACKGROUND OF THE INVENTION

Thermoelectric coolers include a matrix of thermoelectric couples formed of n-type and p-type semiconductor material. The thermoelectric couples are connected electrically in series and thermally in parallel. The thermoelectric couples are sandwiched between two ceramic plates. The two ceramic plates define either the cold side or hot side depending on the connection of the dc voltage. With a positive dc voltage applied to the n-type thermoelement, electrons pass from the p- to the n-type thermoelement and the cold side temperature will decrease as heat is absorbed. Cooling is proportional to the current and the number of thermoelectric couples, and occurs when electrons pass from a low energy level in the p-type thermoelement to a higher energy level in the n-type thermoelement. The heat is then conducted through the thermoelement to the hot side, and liberated as the electrons return to a lower energy level in the p-type thermoelement. To keep the device working, it is necessary to remove the heat dissipated at the hotside. Thus, a heat sink is attached to the hot side for heat removal. The thermoelements are hereinafter referred to as "legs".

Prior thermoelectric coolers have been fabricated using flat conductive tabs stamped from strips of conductive metal preferably copper. Each tab has a size sufficient to receive ends of a pair of legs in a spaced relationship.

The tabs are placed in a grid type mold by placing the tabs on the grid and brushing the grid in a manner to orient the tabs for grid acceptance. A ceramic plate is then screen printed with a solder paste. The grid with tabs is then pressed against the solder paste portions of the plate. The tabs stick to the ceramic plate and the grid removed. The tabbed ceramic plate is then placed in a furnace to reflow the solder to substantially permanently attach the tabs to the ceramic plate. Two grids are used. A first type grid contains the hot side pattern and the second type grid contains the cold side pattern. A solder flux is then applied to the tabs of the tabbed ceramics. A leg matrix mold is then filled with legs by vibrating the legs into the mold. The filled mold is then aligned with the solders fluxed tabs of a first one (either the hot or cold side) of the tab patterned ceramics and pressed into the solders flux. The leg matrix mold is then removed and the legs permanently attached to the tabs by reflowing the solder. To complete the thermoelectric couple the opposing ends of the legs are similarly attached to the patterned tabs of a second one (either cold or hot as appropriate) of the tab bearing ceramics.

A problem with the existing thermoelectric cooler is its cost. The complexity of the elements for the component parts of the thermoelectric cooler dictates that considerable manual labor be expended in the process for assembling the elements for machine combination into components, and assembling the components for machine combination into thermoelectric coolers.

SUMMARY OF THE INVENTION

Accordingly it is an object of the invention to provide an improved thermoelectric cooler and an improved method of manufacture for reducing substantially the cost of the thermoelectric cooler and increasing its applications.

Another object of the invention is to improve the provisioning of insulating plates with conductive tabs.

Yet another object of the invention is to improve tab construction for facilitating leg attachment.

Still another object of the invention is to improve tab configuration and placement on the insulating plates for minimizing the size of the insulating plates.

Briefly stated, the invention in a first embodiment includes attaching a high temperature adhesive tape to a side of a corresponding strip of conductive material opposite a solder bearing side. A pattern of tabs is stamped from the conductive strip onto the adhesive tape. Next, a plate of insulating material is stuck to the solder bearing sides of the tabs and the solder reflowed to attach substantially permanently the tabs to the insulating plate. After soldering the conductive strip to the insulating plate, the adhesive tape is stripped from the conductive strip. Then, the process is repeated to form a second pattern of tabs on a second insulating plate. In this manner the insulating plates are patterned with tabs for a hot side and a cold side for the thermoelectric element. The thermoelectric element is completed by soldering hot side and cold side patterned tabs to legs in the typical manner.

In a second embodiment of the invention, a strip of conductive material having the solder layers is blanked to form the desired first pattern of tabs in the strip. The blanked tabs of the conductive strip are then stuck to a first insulating plate and the solder reflowed to attach the tabs of the blanked strip of conductive material to the insulation plate. After which, the remainder of the conductive strip is stripped from the tabs. The process is repeated to form the desired second pattern of tabs on a second insulating plate. The thermoelectric element is completed by attaching opposing ends of the legs to the patterned tabs of the hot side and cold side insulation plates by reflowing the solders of the tabs.

In either the first or second embodiment, the tabs of the conductive strip can be provided with pockets for receiving the legs. The forming of the pockets in the tabs, by stamping, wedges the tabs in the conductive strip. Thus, in either embodiment the need for high temperature adhesive tape is eliminated. The pockets are shaped either to correspond to the shape of the legs, or are circular to receive either circular or sided legs of the thermoelectric elements. For circular pockets, the tabs may be Lemniscate of Bernoulli shaped. The Lemniscate or Bernoulli shaped tabs are hereafter referred to as "peanut" shaped.

BRIEF DESCRIPTION OF THE DRAWINGS

Other objects and features of the invention will become more readily apparent from the following detailed description when read in conjunction with the accompanying drawings, in which:

FIGS. 4b and 4c are taken along lines A—A and B—B of FIGS. 2 and 3, respectively;

DETAILED DESCRIPTION OF PREFERRED EMBODIMENTS

Figure 1:
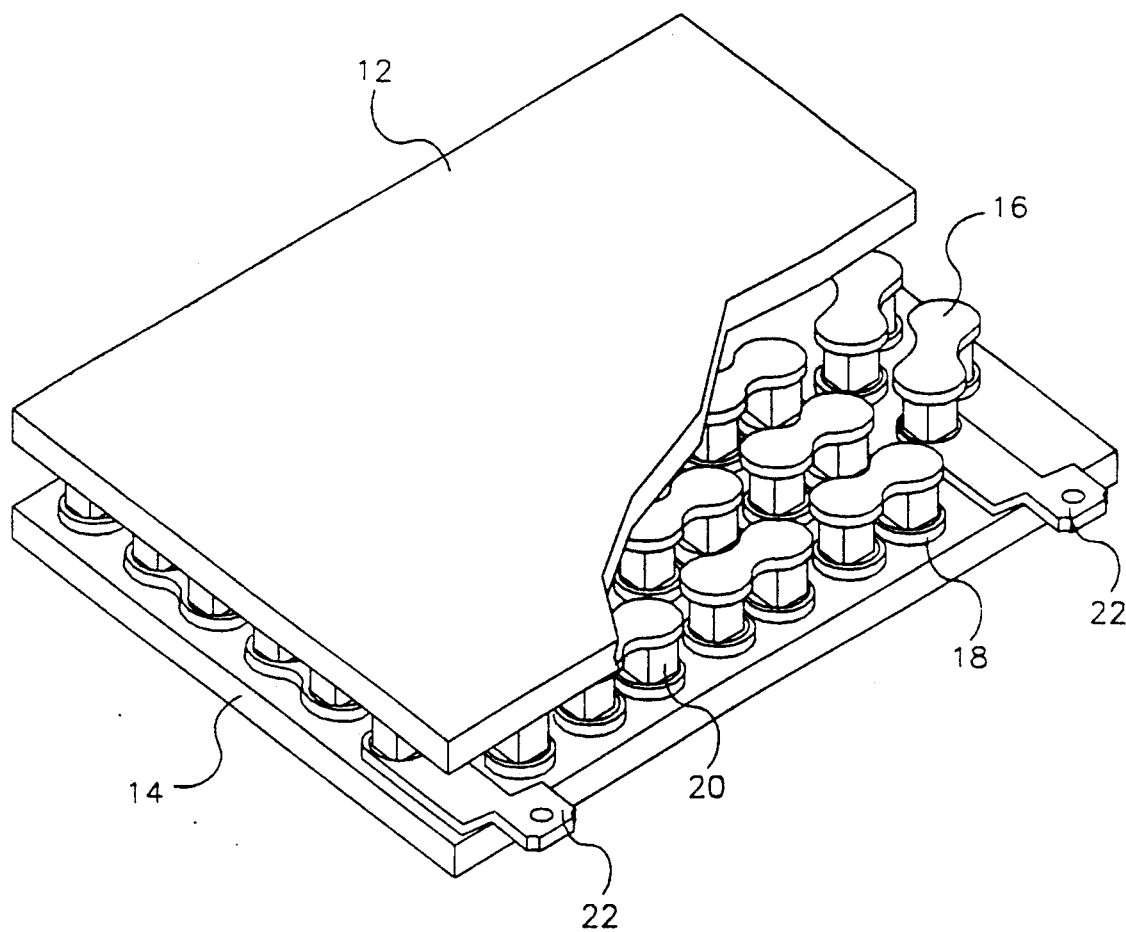
FIG. 1 is an isometric view of a thermoelectric cooler embodiment of the present invention.
Figure 2:
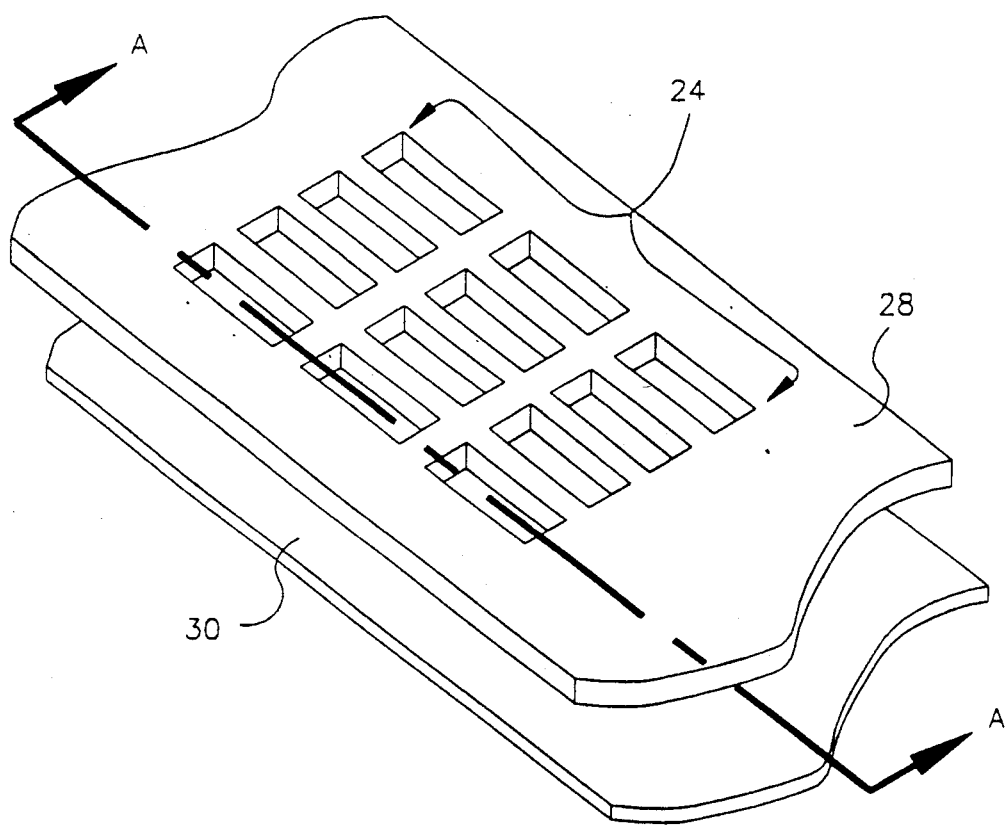
FIGS. 2 and 3 are partial isometric views of the strips including hot and cold side tab array patterns in accordance with a first embodiment of the invention.
Figure 3:
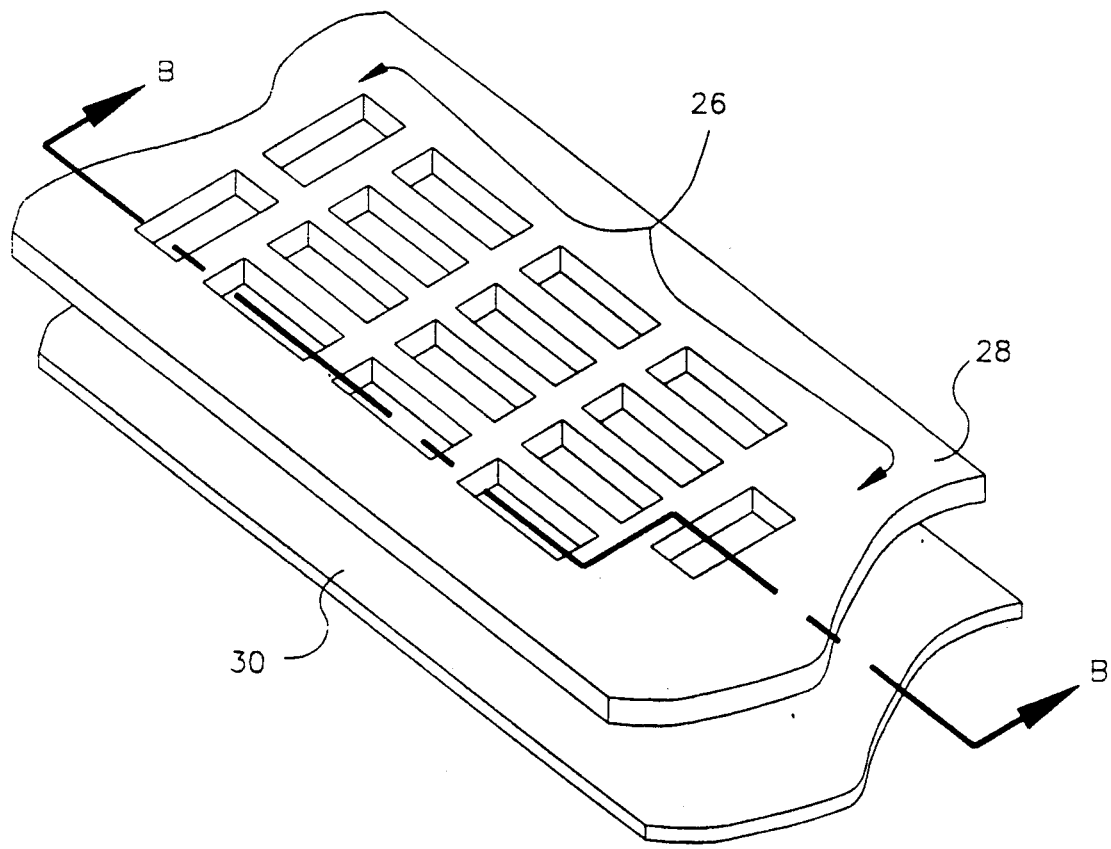

Referring now to FIG. 1, the thermoelectric cooler 10 includes insulating plates 12 and 14. Plates 12 and 14 are typically ceramic plates. Peanut shaped conductive tabs 16 are attached to or formed on plates 12 and 14 by stamping or blanking or by thick film printing techniques, or other photolithographic techniques. The conductive tabs 16 are arranged on plate 12 in a pattern for a hot side plate (FIG. 2) and on plate 14 in a pattern for a cold side plate (FIG. 3). The tabs 16 as shown in FIG. 1 have pockets 18 formed in end portions for legs 20. Other tab configurations will be described hereinafter. The legs 20, which are alternately of n-type and p-type semiconductor material, are soldered to the hot plate side and the cold side plate. Spade connectors 22 are attached to corner tabs 16 on one side of the cold side plate 14 for connecting a dc source of power (not shown) to the thermoelectric unit.

The difference between cold side and hot side tab patterns 24 and 26 (FIGS. 2 and 3) is that the hot side includes end tabs disposed normal to the intermediate tabs for connecting the rows of legs in series in a serpentine manner. It will be appreciated that the patterns shown have been abbreviated for purposes of description and in practice may have any number of rows and columns of tabs. The number of tabs selected is to demonstrate only how the rows and columns are connected to the legs.

Figure 4A:
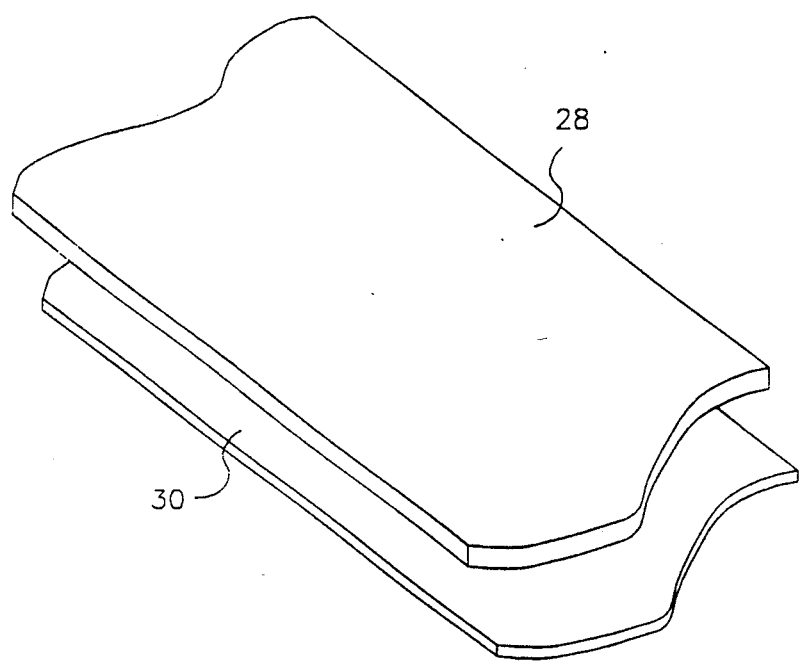
FIGS. 4a-4c are partial views showing the fabrication of the rectangular patterns for the hot and cold side tab arrays of a first embodiment of the invention.
Figure 4B:
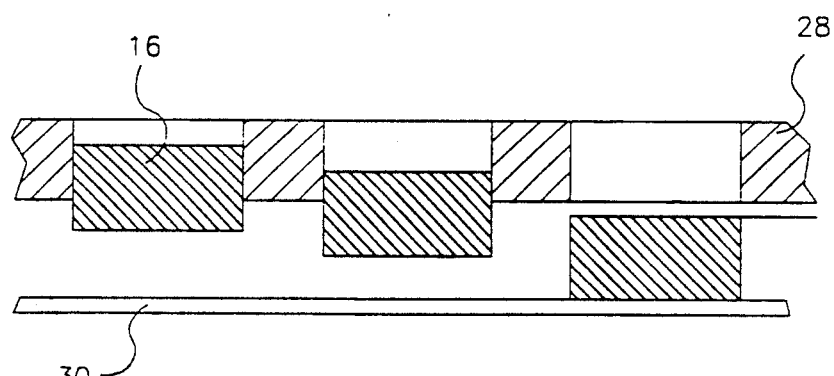
Figure 4C:
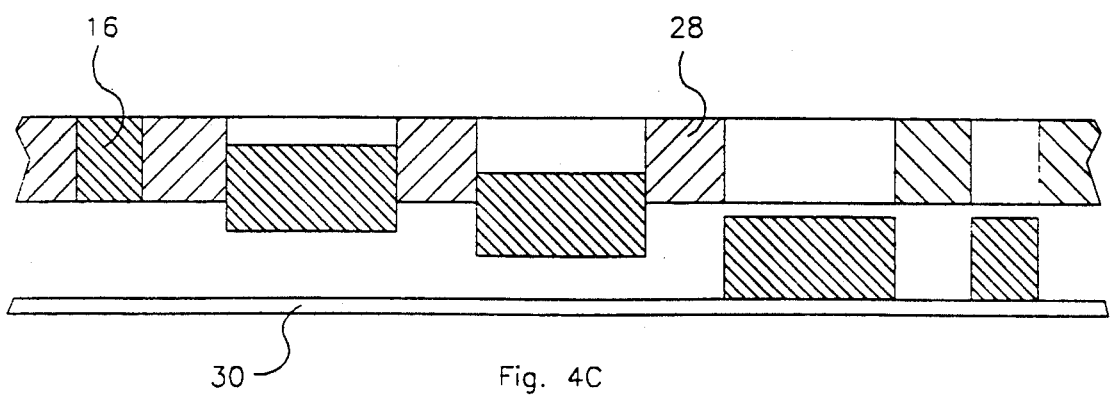
Figure 5:
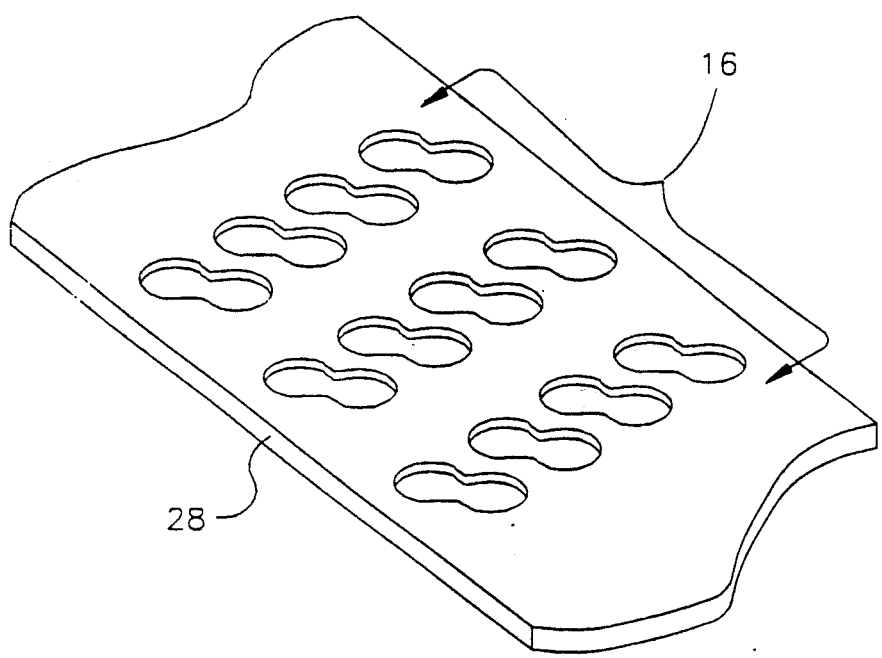
FIG. 5 is an isometric view of a variation of the tab shape of the arrays of FIGS. 2 and 3 of the first embodiment.
Figure 6:
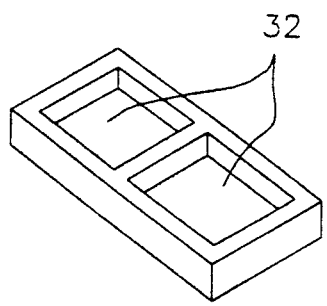
FIGS. 6 and 7 are isometric views of the pocketed tabs of strips of FIGS. 5, 2, and 3 including blanked and coined pocket tabs.
Figure 7:
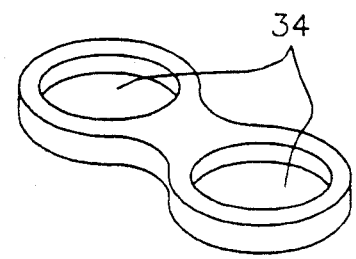

In a first embodiment, the tab patterns are made as follows. A strip of tab material 28 (FIG. 4a) which is, for example, a Ni-SnPb plated copper strip, is stuck to the adhesive side of a high temperature adhesive tape 30. A suitable tape is sold by the 3M Company under the trade mark KAPTON. Dies (not shown) having the cold side and hot side tab patterns formed thereon are struck against the strip as it passes by to stamp the side pattern tabs out of the strip onto the adhesive tape (FIGS. 4b and 4c). Each plate stamping can be made using a single strike or preferably by using three strikes of the die to complete the tab stamping operation. In this manner a plurality of cold and hot side tab arrays are formed on the tape. The die tabs are contoured to form either rectangularly shaped (FIGS. 2 and 3) or Lemniscate of Bernoulli (peanut) shaped tabs (FIGS. 1 and 5), with or without pockets. Polygon (square) shaped pockets 32 (FIG. 6) or circular shaped pockets 34 (FIG. 7). The tab pockets are for receiving the legs. After stamping the cold and hot side patterns the remaining tab frames are removed thereby leaving the tabs 16 stuck to the adhesive tape.

Figure 8:
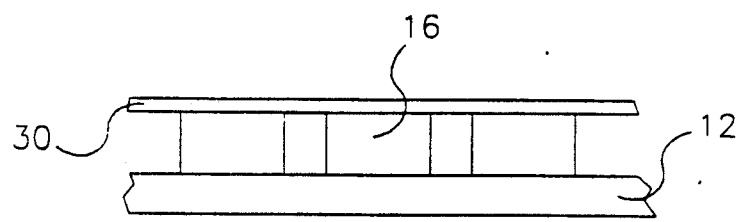
FIG. 8 is a partial side view of the hot side pattern positioned on an insulation plate for attachment.

Next, the array of tabs forming either the hot side pattern 24 (FIG. 2) or the cold side pattern (FIG. 3) is positioned on an insulating plate 12 or 14. FIG. 8 shows in cross section the hot side pattern, which is stuck to the adhesive tape 30, positioned by pressing the solders side of the solder plated tabs onto an insulation plate 12. Then the structure is placed in a furnace for reflowing the SnPb layer to solder the tabs to the plate. After reflow, the high temperature adhesive tape 30 is removed to complete the hot and cold side plates.

Figure 9A:
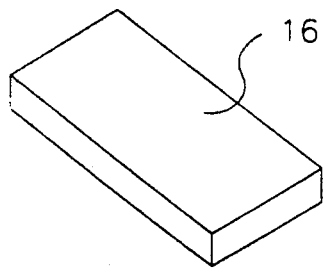
FIGS. 9a and 9b are isometric views of tabs of FIGS. 5, 2 and 3.
Figure 9B:
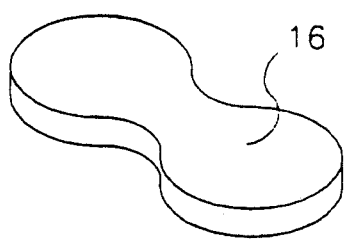

After making the hot and cold side plates, opposing ends of legs 20 are fitted to the tabs. For tabs without pockets (FIGS. 9a and 9b), the legs are attached by vibrating the legs into a frame mold not shown in the typical manner. If the frame can be retained, the frame is then positioned in a furnace with the ends of the legs in contact with the tabs of the tabbed insulation plates 12, 14 (FIG. 1) for attachment to the tabs of the plates using the solder reflow technique. Else the loaded frame with one side 12 or 14 fitted thereto is placed in a furnace for reflowing the solder to attach the legs to the side. Then the frame is removed and the other plate 14 or 12 fitted to the opposite ends of the legs and returned to the furnace for reflowing the solder to attach the second plate.

Figure 10:
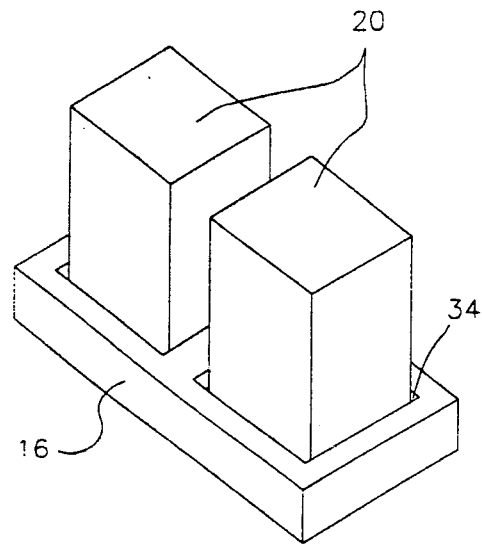
FIGS. 10 and 11 are views showing, respectively, the pocket tabs of FIGS. 9a and 9b with legs of the thermoelectric element attached.
Figure 11:
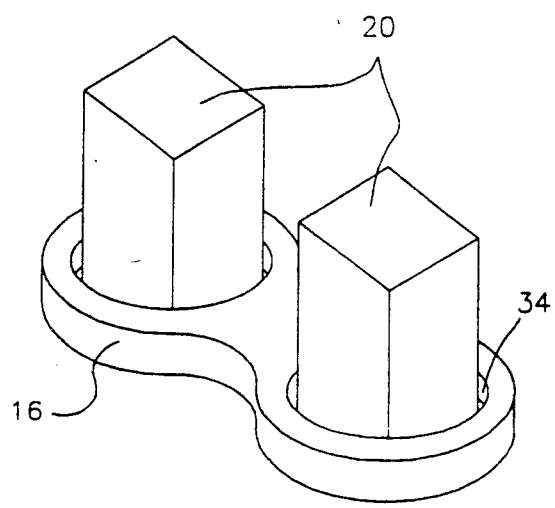

For tabs with pockets 32, 34 (FIGS. 10 and 11), the use of the frame is not required. The legs 20 are vibrated into the pockets 32, 34 of either the hot or cold plate tabs 16 and the pockets of either the cold or hot side plate tabs 16, as appropriate, fitted thereto for attachment by reflowing the solder on the tabs. It will be appreciated by those skilled in the art that use of circular pockets 34 (FIG. 11) is preferred as it alleviates the need to orient the legs and the pockets during vibration; thus, reducing substantially the time required to fill the pockets. Further, those skilled in the art will recognize that the peanut shaped tab is preferred over the rectangular shaped tab as it provides: increased copper area for better heat transfer, increased shear strength for the tab; and increased solder area for improved solderability.

Figure 12:
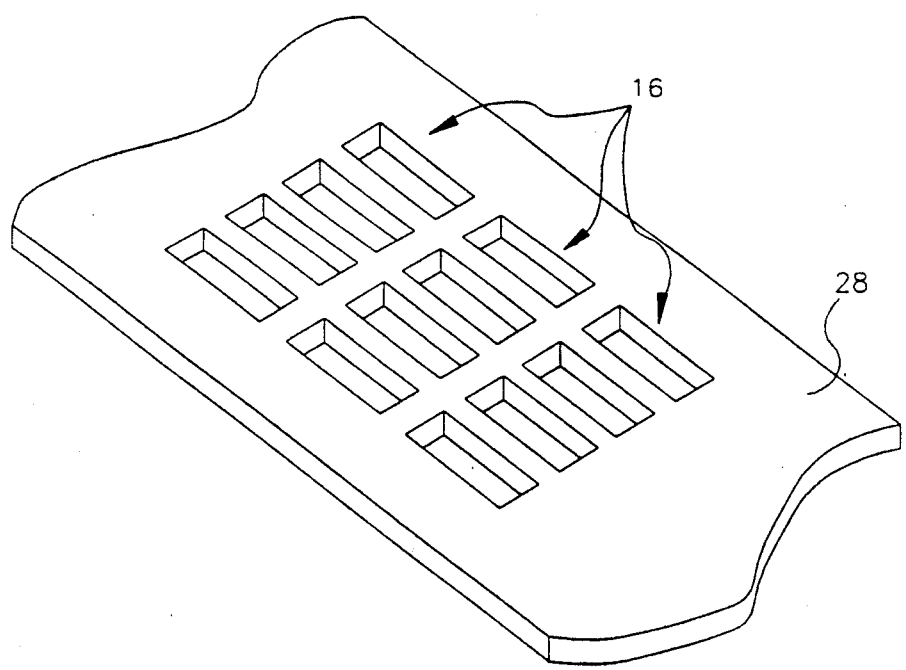
FIG. 12 is an isometric view of a second embodiment of the tab fabrication for the invention.

In a second embodiment (FIG. 12) a blanking operation replaces the stamping operation. Thus, the high temperature adhesive tape is not required for the solder layered strip of conductive material 28. The tab solder layered strip of conductive material is struck with the tab patterned die sufficient only to blank the tabs of the tab pattern in the strip (FIGS. 4a-4c) and the tabs partially returned simultaneously to the strip (FIG. 12) for support. In this manner the cold and hot side patterned strips are formed with the remainder of the strips forming supporting frames for the tab arrays. Then a first blanked strip, which may be either a hot or cold side patterned strip, is positioned over the insulation plate 12 or 14 and attached thereto using the solder reflow technique. Next, the frame portion of the conductive strip 28 is removed to form the first tabbed insulation plate. The process is repeated to form the corresponding cold or hot side plate. After the hot and cold sides are made, the legs are attached as described above in connection with the first embodiment.

Although several embodiments of the invention have been described, it will be apparent to a person skilled in the art that various modifications to the details of con-

What is claimed is:

1. A method for fabricating a thermoelectric device consisting of the steps of:
    attaching a conductive strip to an adhesive tape;
    stamping an array of tabs out the conductive strip in a first pattern onto the attached adhesive tape for a first side of the thermoelectric device;
    using the adhesive tape as a support, attaching the array of tabs forming the first pattern to a plate of insulating material for a first side plate;
    lifting the adhesive tape from the array of tabs to produce a first side plate for a thermoelectric device;
    repeating the above steps to produce a second side plate having attached thereto an arrays of tabs forming a second pattern;
    positioning legs of first and second type conductivity thermoelectric material to form an alternately disposed array of first and second type thermoelectric legs for the thermoelectric device between the first and second side plates with opposing ends of the legs on appropriate ends of opposing tabs; and
    attaching the first and second array of tabs of the first and second side plates to the opposing ends of the legs for forming the thermoelectric device.

2. A method for fabricating a thermoelectric device according to claim 1 comprising layering the conductive strip with a solder prior to stamping and reflowing the solder to attach the opposing ends of the legs to opposing tabs of the first and second side plates.

3. A method for fabricating a thermoelectric device according to claim 1, wherein the stamping of the array of tabs further comprises stamping the tabs in a rectangular shape.

4. A method for fabricating a thermoelectric device according to claim 3 wherein the stamping of the array of tabs further comprises forming pockets adjacent opposing ends of the tabs of a size sufficient for receiving ends of squarely or rectangularly shaped legs without orientation for the thermoelectric device.

5. A method for fabricating a thermoelectric device according to claim 1 wherein the stamping of the array of tabs further comprises stamping the tabs in a peanut shape with ends of tabs adjacent to the center portions of the inbetween tabs.

6. A method of fabricating a thermoelectric device according to claim 5 wherein the stamping of the array of peanut shape tabs further comprises forming pockets adjacent opposing ends of the tabs for receiving ends of legs for the thermoelectric device.

7. A method for fabricating a thermoelectric device according to claim 5 wherein the stamping of the tabs in a peanut shape further comprises stamping circularly shaped pockets adjacent opposing ends of the tabs of a size sufficient for receiving rectangularly or squarely shaped end portions of legs for the thermoelectric device.

8. A method for fabricating a thermoelectric device consisting of the steps of:
    blanking a first pattern of tabs out of a conductive strip of material for forming a first array of tabs of the pattern in the conductive strip, said array of tabs having edge portions engaging corresponding edges of the conductive strip for support and surfaces depending therefrom;
    attaching the conductive strip by the depending surfaces of the tabs of the blanked conductive strip to a plate insulating material for a first side plate;
    lifting the portion of the conductive strip not attached to the plate of insulating material from the array of tabs for forming a first side plate of a thermoelectric device;
    repeating the above steps to produce a second side plate having attached thereto an array of tabs forming a second pattern;
    positioning legs of first and second type conductivity thermoelectric material to form an alternately disposed array of first and second type thermoelectric lets for the thermoelectric device between the first and second side plates with opposing ends of the legs on opposing tab ends of the first and second side plates; and
    attaching the first and second side plate tabs to opposing ends of the legs for forming the thermoelectric device.

9. A method for fabricating a thermoelectric device according to claim 8 comprising layering the conductive strip with a solder prior to blanking the first and second tab patterns in the conductive strip.

10. A method for fabricating a thermoelectric device according to claim 8 wherein the blanking of the array of tabs conductive strip further comprises blanking the tabs in a rectangular shape.

11. A method for fabricating a thermoelectric device according to claim 10 wherein the blanking of the tabs conductive strip further comprises forming pockets adjacent opposing ends of the rectangular shaped tabs of a size sufficient to receive squarely or rectangularly shaped legs without orientation.

12. A method for fabricating a thermoelectric device according to claim 8 wherein the blanking of the tabs conductive strip further comprises blanking the array of tabs in a peanut shape and in rows with ends of tabs adjacent the center portions of inbetween tabs.

13. A method for fabricating a thermoelectric device according to claim 12 wherein the blanking of the tabs conductive strip further produces pockets in opposing ends of the peanut shape tabs.

14. A method for fabricating a thermoelectric device according to claim 13 wherein the pockets formed in the peanut shaped tabs are circularly shaped pockets for receiving squarely or rectangularly shaped legs without orientation.

15. A method for fabricating a thermoelectric device consisting of the steps of:
    producing first and second patterned arrays of tabs and tab array supports, said supports having means facilitating attachment of the first and second patterned arrays of tabs to first and second plates of insulation material;
    attaching the tabs of the first and second arrays with the tab array supports to first and second plates of insulation material, respectively;
    lifting the tab array supports from the first and second array of tabs for producing first and second side plates;
    positioning legs of first and second type conductivity thermoelectric material between the first and second side plates with opposing ends on preselected tabs; and
    attaching the opposing ends of the legs to the preselected tabs of the first and second arrays of tabs for forming a thermoelectric device.

* * * * *